United States Patent [19]

Paek

[11] Patent Number: 4,988,153

[45] Date of Patent: Jan. 29, 1991

[54] HOLOGRAPHIC MEMORY READ BY A LASER ARRAY

[75] Inventor: Eung-Gi Paek, Freehold, N.J.

[73] Assignee: Bell Communications Research, Inc., Livingston, N.J.

[21] Appl. No.: 455,308

[22] Filed: Dec. 22, 1989

[51] Int. Cl.$^5$ .............................................. G03H 1/22
[52] U.S. Cl. .................................... 350/3.8; 350/3.71; 350/3.73; 350/3.75; 365/216; 365/235; 369/103
[58] Field of Search .................... 350/3.6, 3.67, 3.7, 350/3.73, 3.75, 3.77, 3.78, 3.8, 3.81, 3.82; 235/457; 365/125, 216, 235; 369/103

[56] References Cited

U.S. PATENT DOCUMENTS

| | | |
|---|---|---|
| 3,542,448 | 11/1970 | Reynolds et al. |
| 3,651,498 | 3/1972 | Magill et al. |
| 3,841,729 | 10/1974 | Ando-Miyazawa |
| 4,094,011 | 6/1978 | Nagao ............................ 365/216 |
| 4,277,137 | 7/1981 | Upatnieks et al. |
| 4,633,445 | 12/1986 | Sprague ......................... 365/235 |
| 4,677,629 | 6/1987 | Lesh .............................. 350/3.73 |
| 4,884,243 | 11/1989 | Johnston et al. ................ 365/64 |

OTHER PUBLICATIONS

T. K. Gaylord, Handbook of Optical Holography, ed., H. J. Caulfield, Academic Press, 1979, pp. 387-393.
E. Paek and A. Von Lehmen, "Holographic Associative Memory for Word-Break Recognition", Optics Letters, 1989, vol. 14, pp. 205-207.
Bleha et al., "Application of the Liquid Crystal Light Valve to Real-Time Optical Data Processing", Optical Engineering, 1978, vol. 17, pp. 371-384.
Jewell et al., "Low-Threshold Electrically Pumped Vertical-Cavity Surface-Emitting Microlasers", Electronics Letters, 1989, vol. 25, pp. 1123-1124.
Lee et al., "Volume Holographic Interconnections with Maximal Capacity and Minimal Cross Talk", Journal of Applied Physics, 1989, vol. 65, pp. 2191-2194.

Primary Examiner—Bruce Y. Arnold
Assistant Examiner—Jay Ryan
Attorney, Agent, or Firm—James W. Falk; Charles S. Guenzer

[57] ABSTRACT

A holographic memory read-out system in which multiple pages of information are angularly multiplexed onto a recording medium, either planar or volume. For read-out of the hologram, a selected one of a plurality of surface-emitting semiconductor lasers arranged in a two-dimensional array is activated. The coherent output beam is passed through a collimating lens which produces a coherent plane-wave having a direction dependent upon which laser in the array produced the output beam. The plane-wave uniformly irradiates the recording medium to thereby diffract a selected image at a set angle to an imaging apparatus.

9 Claims, 3 Drawing Sheets

HOLOGRAPHIC MEMORY READ BY A LASER ARRAY

GOVERNMENT INTEREST

This invention was made with Government support under Contract DAAL01-89-C-0900 awarded by the Department of the Army. The Government has certain rights in this invention.

FIELD OF THE INVENTION

The invention relates generally to randomly addressable memories. In particular, the invention relates to a selectable holographic memory.

BACKGROUND OF THE INVENTION

Holographic memories have long promised a means of storing large amounts of information in a compact medium. Recent advances in information technology have emphasized the storage of pictorial images rather than purely digital information. Furthermore, optical computing systems have been proposed which parallel process a large number of optical input data. Holographic memories have natural advantages for storage of such optical data. Nonetheless, the problems of holographic memories have prevented their widespread use.

It is generally desirable in a large memory that different parts of the memory space be randomly accessible. There have been many proposals for spatial multiplexing of holographic memories that allows such random accessibility. In such spatial multiplexing, a holographic recording medium (a photographic plate may be taken as a simple example) is divided into a spatial array of subholograms which are holographically recorded with separate pages of information. In the read-out procedure, a coherent beam of light, such as from a laser, is directed to the desired subhologram so as to read out a desired page of information. Such spatial multiplexing systems are disclosed, for example, by Magill et al in U.S. Pat. No. 3,651,498, by Ando et al in U.S. Pat. No. 3,841,729 and by Nagao in U.S. Pat. No. 4,094,011. Reynolds et al in U.S. Pat. No. 3,542,448 disclose a spatial multiplexing system in which a 100×100 matrix array of injection lasers of indeterminate structure are used as reference beams. One of the lasers is selected to illuminate a respective area of a recording medium while the recording medium is being simultaneously irradiated by an information beam produced by a 1000×1000 array of injection lasers. The problem of the required coherence between lasers is not addressed by Reynolds et al. On read-out, one of the 100×100 lasers is activated to irradiate the selected area.

In spite of the great interest in spatial multiplexing, it is not considered to fully exploit the potential of holographic memories. Holographic memories are typically configured to store the spatial Fourier transforms of information. Therefore, a spatially small defect in the recording medium, while affecting a large quantity of information, may be small enough as to not render any bit of information unreadable. That is, holographic memories are to some extent fault tolerant. However, with spatial multiplexing a recording defect which may be small for the entire recording medium may be large enough on the subhologram as to render it unreadable. Furthermore, there is a problem with cross-talk between neighboring subholograms. Lastly, prior art spatially multiplexed holographic memories have suffered from the problem of optics that need to be critically aligned in order to achieve coherent beams over different areas of the recording medium.

A further holographic technique, referred to as angular multiplexing, overcomes many of the disadvantages of spatial multiplexing. A hologram is recorded by the constructive interference between an image beam (containing the image to be recorded) and a reference beam. In angular multiplexing, multiple holographic images may be recorded on the same area of the recording medium if there are differences in the writing angle $\theta_W$ between the object beam and the reference beam. On reconstruction (read-out), the corresponding reading angle $\theta_R$ of the reference beam on the recording medium will determine which of the images will be constructively imaged on the image plane. There may be a two-dimensional distribution of angular differences, allowing a large number of independently recorded and accessed images. In angular multiplexing, every image is spread out over the entire recording medium to improve fault tolerance, cross-talk is reduced, and thus the recording density on the holographic memory is increased. Gaylord discloses a type of angular multiplexing on pages 387-393 in the textbook "Handbook of Optical Holography" (ed., H. J. Caulfield, Academic Press, 1979).

Nonetheless, angularly multiplexed holographic memories have not found widespread application. All known prior art systems have used a single laser source to produce the coherent read-out beam. Then some sort of beam steering is required to deflect the beam at the selected angle with respect to the holographic recording medium. Beam steerers based on mechanically movable optics have inherent limitations and will not be discussed. Two of the more advanced types of beam steerers are an XY beam deflector and a spatial light modulator.

An XY beam deflector consists of two acousto-optic or electro-optic deflectors with associated anamorphic optical components. The deflectors act as diffraction gratings with an electrically controllable period. The laser beam is initially expanded into a large plane wave and then directed by the XY beam deflector at the desired two-dimensional angle with respect to the recording medium. A further set of optics image the light diffracted from the holographic recording medium onto an image plane, for example, a two-dimensional photodetector array. This system is, however, bulky and complicated. The capacity-speed product is inherently limited by the frequency bandwidth of the deflectors. For example, an acousto-optic deflector with a frequency bandwidth $\Delta f = 100$ MHz allows only 50 resolvable directions into which the beam can be directed in less than 1 $\mu$sec.

A spatial light modulator (SLM) is a device which receives a plane wave laser beam and passes only those spatial portions, which are coherent with each other, that have been selected by a separate non-coherent image shone thereupon. Paek et al have proposed the use of a SLM in an associative holographic memory in a technical article entitled "Holographic associative memory for word-break recognition" appearing in Optics Letters, volume 14, 1989 at pages 205-207. A similar use is disclosed in a technical article by Bleha et al entitled "Application of the liquid crystal light valve to real-time optical data processing" appearing in Optical Engineering, volume 17, 1978 at pages 371-384. Although an SLM presents conceptual advantages for angularly multiplexed holographic memories, they are bulky and expensive. Further, the relatively poor quality of available SLMs cause poor reconstructed image quality because of their limited resolution and poor contrast.

SUMMARY OF THE INVENTION

Accordingly, an object of the invention is to provide a holographic memory of high capacity, high speed, high fault tolerance and low complexity.

A further object of the invention is to provide an angularly multiplexed holographic memory that avoids the use of beam steerers.

The invention can be summarized as a holographic memory read-out system based on angular multiplexing in which the read-out beam is provided by a selected one of a two-dimensional array of surface emitting lasers integrated onto a single chip. The output of the selected laser is converted to a plane-wave by a lens, and the propagation direction of the plane-wave is determined by the position of the selected laser on the chip. The plane-wave intercepts either a planar or volume holographic recording medium at the selected angle, and thereby a selected image in the recording medium is propagated to an imaging plane, e.g., photodiode array.

DETAILED DESCRIPTION

Figure 1:
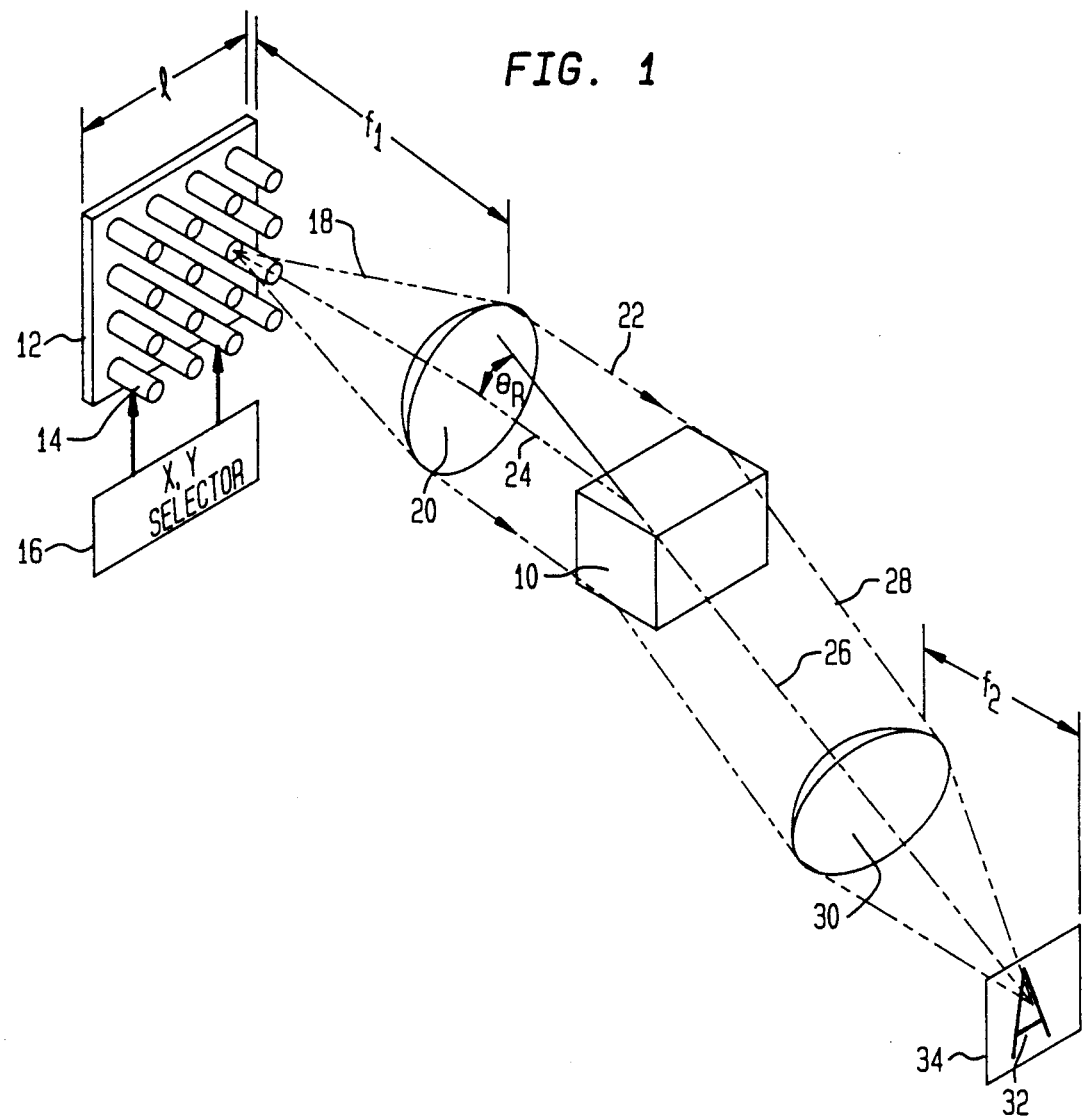
FIG. 1 is a perspective illustration of an embodiment of the read-out apparatus of the holographic memory of the invention.

An embodiment of the holographic memory read-out system of the invention is illustrated in FIG. 1. A number of angularly multiplexed holographic images are assumed to have been already recorded in a holographic recording medium 10. The recording process will be described later. The recording medium 10 may be either a planar or volume recording medium. For the present, it may be assumed to be a planar photographic plate. The read-out system relies on a surface-emitting laser diode array 12 in which a two-dimensional array of individually selected surface-emitting laser diodes 14 are integrated onto a single semiconductor chip. The laser diodes 14 are arranged on a period of a few micrometers so that the lateral dimensions l of the laser array 12 may be of the order of a few tens of micrometers. The electrical activation of the selected laser diode 14 is performed by an XY selector 16.

The optical output of an individual laser diode 14 is diffraction limited so that a coherent conical output beam 18 is produced. A collimating lens 20 having a focal length of $f_1$ is positioned approximately at $f_1$ from the laser array 12 so that the point-like outputs of the laser diodes 14 are in the focal plane. Thereby, the collimating lens 20 converts the conical beam 18 into a collimated beam 22 which has a coherent, plane-wave wavefront.

This plane-wave beam 22 is incident upon the recording medium 10. Importantly, the slightly displaced positions of the variously selected laser diodes 14 cause the angle of incidence of the plane-wave beam 22 upon the recording medium 10 to be a function of which laser diode 14 is selected. This incident angle will be denominated as $\theta_R$ and is the angle between an image optical axis 26, to be described somewhat later, and the selected reference beam axis 24.

The recording medium 10 is positioned relatively close to the collimating lens 20 in order that, regardless of the angle $\theta_R$ of the plane-wave beam 22 and its selected reference beam axis 24, it uniformly irradiates the recording medium 10, or at least a single entire area of it regardless of which laser diode 14 is selected. The value of the focal length $f_1$ of the collimating lens 20 is very much larger than the dimension l associated with the selected positions on the laser array 12. Therefore, variations $\Delta\theta_R$ in the incident angle $\theta_R$ are very small, of the order of hundredths of a degree, so that despite the angle steering each selected beam uniformly illuminates the recording medium 10. The selective angle $\theta_R$ of the plane-wave beam 22 effects the angular multiplexing of this holographic memory system.

It is to be understood that the reading angle $\theta_R$ and the corresponding writing angle $\theta_W$ are two dimensional angles. In view of their small variations about their central values $\theta_{RO}$ and $\theta_{WO}$, they are easily defined by Cartesian coordinates x and y arranged about the central angles $\theta_{RO}$ and $\theta_{WO}$ and in direct correspondence with the X and Y coordinates of the laser diodes 14.

The holographic image stored at the selected angle in the recording medium 10 causes the plane-wave beam 22 to diffract along the image optical axis 26 into a planar diffracted beam 28 containing the selected image. The image optical axis 26 is the same regardless of which diode laser 14 has been selected. A focusing lens 30 of focal length $f_2$ focuses a resultant image 32 on an imaging plane 34, such as a photo-detector array, lying in the focal plane of the focusing lens 30. Dependent on which laser diode 14 is selected, a different image 32 is displayed. For minimum aberration, the recording medium 10 is separated from the collimating lens 20 by a distance equal to its focal length $f_1$ and from the focusing lens 30 by a distance equal to its focal length $f_2$.

One feature of the present invention is that if the XY selector 16 selects more than one laser diode 14, then multiple independent images are superimposed on the imaging plane 34.

Practical surface-emitting laser diode arrays have only recently been reported. They are the subject of U.S. patent application, Ser. No. 07/380,996 filed July 17, 1989 by Jewell et al. This same work has been reported by Jewell et al in a technical article entitled "Low-threshold electrically pumped vertical-cavity surface-emitting microlasers" appearing in Electronics Letters, volume 25, 1989 at pages 1123-1124. This work was apparently the first to demonstrate two-dimensional arrays of vertically arranged diode lasers which were electrically pumped by current electrodes on the ends of the laser cavities. The lasers were formed with quantum well active layers of AlAs and vertical resonant optical cavities having interference-type dielectric end mirrors, all formed of III-V semiconducting materials. The laser array 12 illustrated in FIG. 1 shows that the individual laser diodes 14 are pillars formed on the light emitting side of the array 12. In fact, in the Jewell et al array, the pillars were formed on the back side and the light was emitted through a planar substrate which was transparent yet conductive so that it was used as a common electrode. The pillars were individually contacted on the other electrode so as to provide laser selection. Some of the Jewell et al laser arrays were used in demonstrating the present invention. The individual lasers had diameters of a few micrometers, which would allow over a million independent lasers on a 1 cm² semiconductor chip. The wavelength of the laser light was 960 nm with a linewidth of ~0.1 nm. Thus, the coherence length was several centimeters and the spectral resolution was about 10,000. Because the laser threshold current for the smaller lasers was around 1 mA, total power requirements for the system of FIG. 1 are quite modest. The individual lasers produced about 1 mW of optical power allowing holographic reading with a conventional two-dimensional image sensor. Furthermore, the individual lasers exhibit high switching speeds of ~100 ps. Thus, very high speed memory access is possible.

Figure 2:
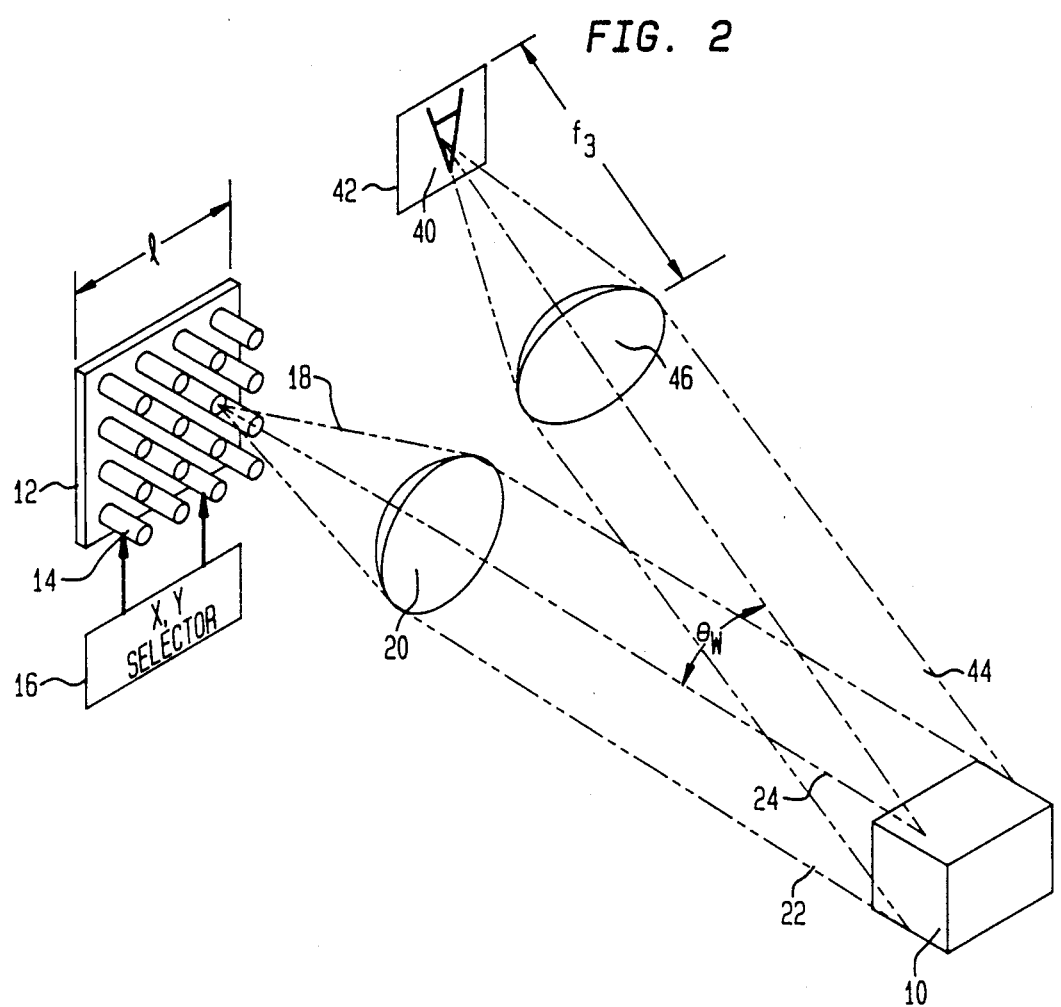
FIG. 2 is a perspective illustration of a design of the recording apparatus usable for recording the holographic memory.

A design for the recording system for the holographic memory of the present invention is illustrated in FIG. 2. It uses the same recording medium 10, surface-emitting laser diode array 12, XY selector 16 and collimating lens 20 as in the read-out apparatus of FIG. 1. During recording, however, an image 40 is presented on a image light source 42. Assuming that the image light source 42 produces a spatially resolved pattern 40 of coherent point light sources, the image light source 42 is separated by a distance $f_3$ along an object optical axis 44 from a recording collimating lens 46 having a focal length $f_3$ which collimates the conical beam from the coherent image 40. The recording medium 10 is preferably separated from the recording collimating lens 46 along the object optical axis 44 by a distance equal to the focal length $f_3$ although this distance could be reduced to save space. As a result of this configuration, a Fourier transform of the image 40 is recorded on the recording medium 10 when any laser diode 14 is activated simultaneously with the image 40. To record multiple, independent images in the recording medium 10, different images are sequentially displayed on the image light source 42 and then a different one of the diode lasers 14 is selected by the XY selector 16. The position of the selected diode laser 14 causes a small change in the angle $\theta_W$ between the selected reference beam axis 24 and the object optical axis 44. The angular differences $\Delta\theta_W$ are small, of the order of a few hundredths of a degree.

The image light source 42 must provide a coherent image. Another surface-emitting laser diode array could be used if all the diode lasers in that array were coherent (phase-locked) with each other and with the selected diode laser 14 on the array 12. Work is progressing on achieving phase-locked laser arrays but such an array is not available at this time. Alternatively, a spatial light modulator could be used for the image light source 42 in conjunction with a single laser if that laser could be made phase-locked with the selected diode laser 14. Phase-locking from a beam splitter positioned in front of the laser array 12 could accomplish this task. However, in the demonstration of the present invention a more conventional, single-source holographic Fourier recording scheme was used. One reason for this choice was the lack of a holographic recording medium recordable at the surface-emitting laser wavelength of 960 nm.

Figure 3:
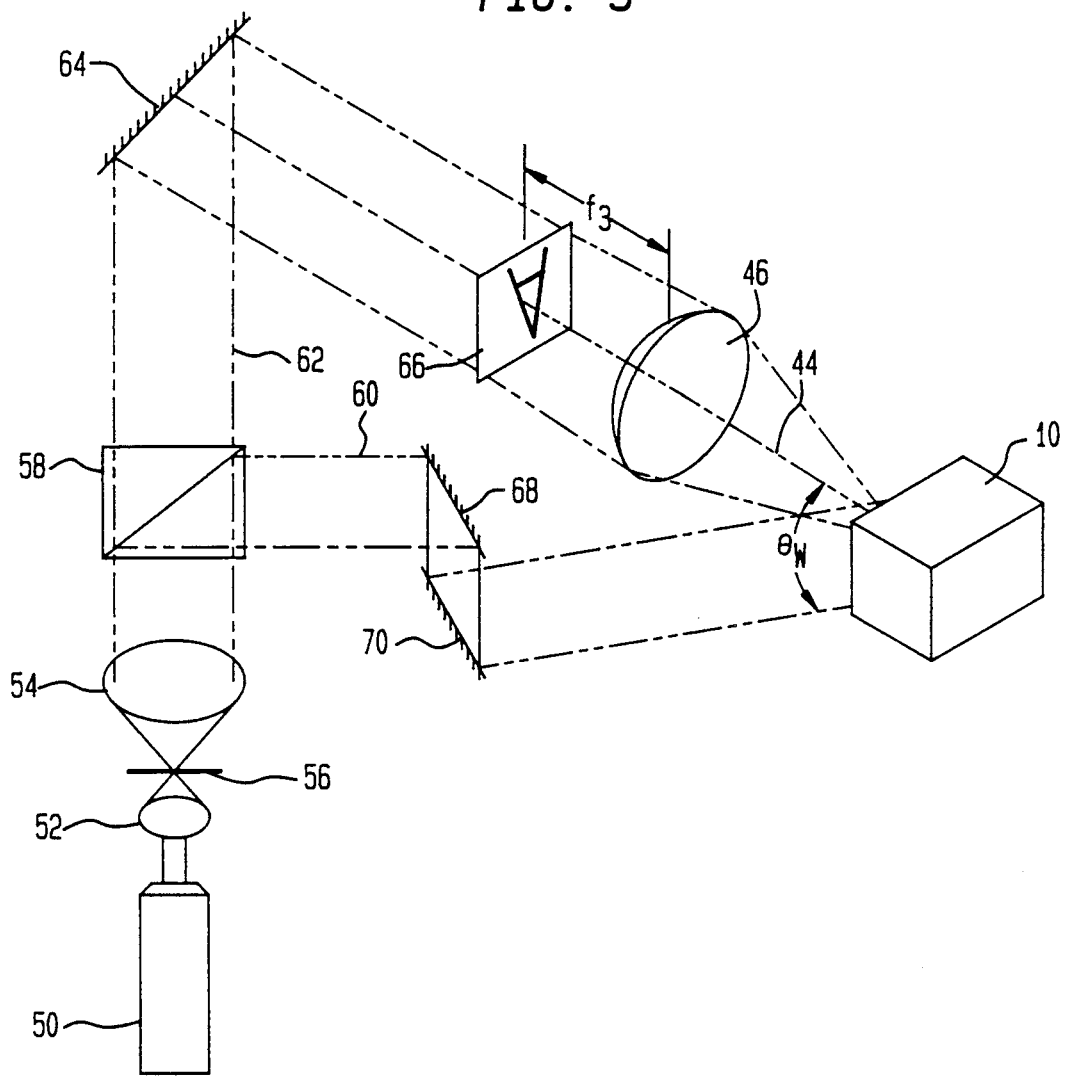
FIG. 3 is a perspective illustration of a tested design of the recording apparatus.

In the actually used recording apparatus, as illustrated in FIG. 3, an argon laser 50 produced a collimated output beam with a wavelength $\lambda_W$ of 514.5 nm which thus differs by almost a factor of two from the reading wavelength $\lambda_R$. The beam was expanded by two lenses 52 and 54 with a pinhole spatial filter 56 between the lenses 52 and 54 acting to remove any extraneously directed light. The plane-wave beam was then split by a beam splitter 58 into a reference beam 60 and an object beam 62, which were coherent with each other.

The object beam 62, after reflection from a mirror 64 was directed through a two-dimensional spatial light modulator 66 which passed a coherent image through the object collimating lens 46 onto the recording medium 10. The spatial light modulator 64 was a Model H-4060 Liquid Crystal Light Valve, available from Hughes Aircraft Company, Industrial Products Division of Carlsbad, California. A general description of such a light valve appears in the previously cited technical article by Bleha et al. The value of the focal length $f_3$ for the recording collimating lens 46 was 40 cm and it had an aperture of about 7 cm. To reduce the aberrations arising from the difference in writing and reading frequencies $\lambda_W$ and $\lambda_R$ on recording and read-out, the spatial light modulator 66 was precisely placed in the focal plane of the recording collimating lens 46. The separation $f_3$ between the recording collimating lens 46 and the recording medium 10 was not as critical.

The reference beam 60 was steered in orthogonal directions by two movable planar mirrors 68 and 70 and was incident on the recording medium 10 as a plane-wave reference beam at a two-dimensionally selectable incidence angle $\theta_W$ with respect to the object optical axis 44. The interference of the imaged object beam 62 and the steered reference beam 60 caused a hologram to be recorded for the image on the spatial light modulator 66. For recording of another image, the image on the spatial light modulator 66 was externally changed and the mirrors 68 and 70 were moved in correspondence to the directions of the individual diode lasers 14 to produce a very slightly different angle $\theta_W$. The image on the spatial light modulator 66 was optically controlled by an image presented to it by a juxtaposed transparency. In order to improve the fidelity of the spatial light modulator 66, the transparency image was slightly degraded with a diffuser. Image presentation in operational systems would likely rely on electronically generated images.

If the recording and read-out frequencies $\lambda_W$ and $\lambda_R$ were the same, then during recording the mirrors 68 and 70 would be controlled so that the angle $\theta_W$ would be equal to the angle $\theta_R$ of the laser diode 14 assigned to read that image in the read-out apparatus of FIG. 1. However, because a different wavelength $\lambda_W$ was used for recording than the wavelength $\lambda_R$ used for read-out, it was necessary to change the angle defining the conjugate point to conform to the relationship.

$$\frac{\sin\theta_W}{\lambda_W} = \frac{\sin\theta_R}{\lambda_R}.$$

This relationship further means that the direction of the object optical axis 44 in the recording apparatus needs to changed from that for the image optical axis 26 of the read-out apparatus.

EXAMPLE 1

In a first experimentally verified example of the invention, the recording medium was a thermoplastic (TP) plate, Model No. HC-301, available from Newport Corporation of Fountain Valley, California, so that a plane hologram was produced. Sixteen images were recorded on the plate by use of the recording apparatus of FIG. 3. The central angle $\theta_{WO}$ between the image recording beam and the reference beam was 24°, at which the efficiency of the TP plate is maximum. However, the sixteen images were simultaneously recorded from a single transparency substituted for the spatial light modulator 66. Each image on the transparency had a 4 mm square field and they were arranged in a 4×4 matrix. The different locations of the 16 images provided the same variations in 74 $_W$ as would be accomplished by varying the angle of the reference beam 60 in sequential recording.

The recorded TP plate was then transferred to the read-out apparatus of FIG. 1. The laser array 12 had a 4×4 array of lasers 14 arranged on a 1 mm period. Two integrated circuit chips providing the array 12 were used in separate tests. One had the structure described in the Jewell et al application. The other had the same vertical structure but the laser pillars were square in cross-section rather than circular. Tests were made with sub-arrays within these chips of varying laser diameter. Successful tests were made with laser diameters of 5 μm and greater. The collimating lens 20 had a focal length $f_1 = 10$ cm and an aperture of 3.8 cm.

The imaging lens 30 and imaging plane 34 were implemented with a CCD camera attached to a monitor, through which the output data were obtained. The imaging plane 34 was placed at a optical position conjugate to the spatial light modulator 66 in the recording apparatus of FIG. 3. However, the angle defining the conjugate point had to be changed to account for the differences in $\lambda_W$ and $\lambda_R$.

For the tests, the conducting substrate of the laser array 12 was used for one common electrode and a micro-probe was mechanically moved to contact a selected laser diode 14. The micro-probe thus substituted for the XY selector 16 in selecting any one of the 16 images. The selected image was photographically recorded from the monitor attached to the CCD camera. In spite of the mismatch between the recording wavelength $\lambda_W$ and read-out wavelength $\lambda_R$, any of the 16 stored images could be reconstructed with about $10^5$ resolvable spots.

It is noted that with plane holograms all the angularly multiplexed images on the plane recording medium are simultaneously reconstructed on read-out. However, the angular selection places the selected image at a finite window on the image plane 34 with the non-selected images being displaced accordingly outside the window. As a result, each diode laser 14 has to be separated from the adjacent ones by a memory size. This required separation limits the capacity of the memory, which otherwise is given by the space-bandwidth product of the recording medium, typically on the order of $10^8$. This simultaneous reconstruction of the angularly multiplexed images is related to the effect which allowed the simultaneous recording of these same images.

EXAMPLE 2

A second experimental verification of an example of the invention involved a volume hologram. Volume holograms are known to offer greatly increased recording density. The recording density for a plane hologram of dimension L using laser wavelength $\lambda$ is limited to about $(L/\lambda)^2 \approx 10^8$ while for a volume hologram the limiting density is $(L/\lambda)^3 \approx 10^{12}$.

The recording medium 10 was a LiNbO$_3$ crystal doped 0.01% with Fe. This crystal had dimensions of 20×20×7 mm$^3$ and was obtained from Deltronic Co. of Dover, New Jersey. It was oriented with the 7 mm dimension being in the depth direction. The hologram was recorded with the recording apparatus of FIG. 3. Additionally, however, during recording both the reference and object beams were polarized normal to the plane of incidence (ordinary polarization) in order to reduce spurious scattering effects. The c-axis of the LiNbO$_3$ was oriented along the grating direction. These and other details of normal holographic recording may be found in the previously cited book "Handbook of Optical Holography". Two modes of angular multiplexing during recording were performed. In the first, the mirrors 68 and 70 were moved. In the second, the LiNbO$_3$ crystal was rotated by 0.02° between recording holograms to ensure angular separation during read-out. Both methods produced readable holograms.

For read-out, a surface-emitting laser diode array 12 was used with a diode laser size of 5 μm or more and a laser spacing period of 70 μm. This spacing causes an angular separation $\Delta\theta_R$ during reading of about 0.04° and a corresponding angular separation $\Delta\theta_W$ during writing of about 0.02°. Two such angularly separted images were successfully recorded and read with no discernible cross-talk.

The volume recording would be significantly improved if the recording and read-out were performed at the same wavelength. This requires either surface-emitting diode laser arrays operating at shorter wavelengths or photo-refractive materials recordable at longer wavelengths or some combination of the two.

Although the above verified examples used the laser array defined by reactive ion etching so as to produce an array of pillars, as disclosed by Jewell et al, the invention is not so limited. Orenstein et al have described a planar laser array in paper PD22 in the Proceedings of the Optical Society of America, 1989. The vertical structure was very close to that of Jewell et al. However, this planar array was horizontally defined by proton bombardment of the upper cavity mirror so as to confine current to the cavity. The advantage of the planar laser array is the ease of applying separate electrical leads from the XY selector to a large number of lasers. Alternatively, the pillar structure of Jewell et al could be planarized with an insulating material and the separate leads attached to the tops of the pillar lasers. In either case, the conducting substrate acts as a common counter-electrode. If a large number of lasers were to be integrated onto an integrated circuit chip for use in a large holographic memory, the number of separate leads becomes excessive. In this case, the lead-connected electrodes should provide matrix addressing. That is, the top electrodes are connected to rows of lasers and the conducting part of the substrate is separated in the opposing direction to provide bottom connections to columns of lasers.

To exploit the full capabilities of the two-dimensional laser array, fractal patterns could be used on the input memories and the laser array, as has been explained by Psaltis et al in a technical article entitled "Fractal sampling grids for holographic interconnections", appearing in SPIE Proceedings, 1988 at pages 963–970 and by Lee et al in a technical article entitled "Volume holographic interconnections with maximal capacity and minimal cross talk" appearing in Journal of Applied Physics, volumed 65, 1989 at pages 2191–2194.

The holographic memory of the present invention provides for a densely recorded memory. The read-out apparatus allows for very fast read-out of the order of 100 ps per image. Each image can contain of the order of $10^8$ bits of information. Thus, there is a potential information retrieval rate of $10^{18}$ bits per second. Furthermore, the read-out apparatus is rugged with no critical optical alignment required.

What is claimed is:

1. A holographic memory system for reading a holographic recording medium recorded with angularly multiplexed pages of information, comprising:
   a two-dimensional array of surface-emitting lasers formed on an integrated circuit chip;
   means for activating a selected one of said lasers to produce a coherent optical output beam; and
   a collimating lens system for collimating said output beam produced by any of said activated lasers to fall upon an entire area of said recorded holographic medium at an incident angle dependent upon which of said lasers has produced said output beam.

2. A holographic memory system as recited in claim 1, wherein said laser array is disposed in a focal plane of said collimating lens system, whereby a substantially plane, coherent wave propagates toward said recording medium.

3. A holographic memory system as recited in claim 2, further comprising a planar recording medium acting as said holographic recording medium.

4. A holographic memory system as recited in claim 2, further comprising a volume recording medium acting as said holographic recording medium.

5. A holographic memory system as recited in claim 2, wherein said surface-emitting lasers are vertical cavity, compound semiconductor lasers.

6. A holographic memory system as recited in claim 2, further comprising a second lens system receiving a beam diffracted from said holographic recording medium and an imaging apparatus having an imaging plane disposed in a focal plane of said second lens system.

7. A holographic memory system as recited in claim 6, wherein said imaging apparatus comprises an array of photodetectors.

8. A holographic memory system as recited in claim 1, wherein a spacing of said lasers on said integrated circuit chip and a focal length of said collimating lens system provide an angular difference between said incident angles for neighboring ones of said lasers of no more than 0.04°.

9. A holographic memory system as recited in claim 1, wherein said activating means includes means for simultaneously activating a selected plurality of said lasers.

* * * * *